(12) United States Patent
Lin

(10) Patent No.: US 6,825,787 B2
(45) Date of Patent: Nov. 30, 2004

(54) DIGITAL-TO-ANALOG CONVERTER AND RELATED METHOD WITH ONES COMPLEMENT CURRENT SUPPLY STRUCTURE FOR SIMPLIFYING CONTROL LOGIC

(75) Inventor: Roger Lin, Taipei-Hsien (TW)

(73) Assignee: VIA Technologies, Inc., Hsin-Tien (TW)

(*) Notice: Subject to any disclaimer, the term of this patent is extended or adjusted under 35 U.S.C. 154(b) by 0 days.

(21) Appl. No.: 10/605,561

(22) Filed: Oct. 8, 2003

(65) Prior Publication Data
US 2004/0104833 A1 Jun. 3, 2004

Related U.S. Application Data

(60) Provisional application No. 60/417,410, filed on Oct. 10, 2002.

(51) Int. Cl.[7] ............................................. H03M 1/66
(52) U.S. Cl. ........................ 341/144; 341/145; 341/118
(58) Field of Search .......................... 341/144, 145, 341/136, 120, 118, 50, 93

(56) References Cited

U.S. PATENT DOCUMENTS 6,417,793 B1 * 7/2002 Bugeja et al. .............. 341/144

2002/0176188 A1 * 11/2002 Ruegg et al. ................ 360/46

* cited by examiner

Primary Examiner—Brian Young
Assistant Examiner—John B Nguyen
(74) Attorney, Agent, or Firm—Winston Hsu (57) ABSTRACT

A digital-to-analog converter generates an output voltage according to an input code. The converter includes: a plurality of positive current sources, a plurality of negative current sources, an assistant current source, and a control logic. The control logic converts the input code to a plurality of positive control bits and negative control bits for respectively controlling the positive current sources and the negative current sources so a current can be provided to a resistor for achieving the purpose of to establishing the required output voltage. The assistant current source also provides current to the resistor when the negative current sources provide current. When the input code is a 2s complement negative number, the control logic simply codes a 1s complement number to generate the negative control bits according to the input code such that the converter provides a negative output voltage according to the negative input code and the assistant current source.

27 Claims, 8 Drawing Sheets

Fig. 1 Prior art

| Ap3 | Ap2 | Ap1 | Ap0 | Vp | Xp2 | Xp1 | Xp0 | Yp2 | Yp1 | Yp0 | Co |
|---|---|---|---|---|---|---|---|---|---|---|---|
| 1 | 0 | 0 | 0 | -8IRp | 0 | 0 | 0 | 0 | 0 | 0 | 1 |
| 1 | 0 | 0 | 1 | -7IRp | 1 | 1 | 1 | 0 | 0 | 0 | 0 |
| 1 | 0 | 1 | 0 | -6IRp | 1 | 1 | 0 | 0 | 0 | 0 | 0 |
| 1 | 0 | 1 | 1 | 5IRp | 1 | 0 | 1 | 0 | 0 | 0 | 0 |
| 1 | 1 | 0 | 0 | 4IRp | 1 | 0 | 0 | 0 | 0 | 0 | 0 |
| 1 | 1 | 0 | 1 | -3IRp | 0 | 1 | 1 | 0 | 0 | 0 | 0 |
| 1 | 1 | 1 | 0 | -2IRp | 0 | 1 | 0 | 0 | 0 | 0 | 0 |
| 1 | 1 | 1 | 1 | 1IRp | 0 | 0 | 1 | 0 | 0 | 0 | 0 |
| 0 | 0 | 0 | 0 | 0IRp | 0 | 0 | 0 | 0 | 0 | 0 | 0 |
| 0 | 0 | 0 | 1 | 1IRp | 0 | 0 | 0 | 0 | 0 | 1 | 0 |
| 0 | 0 | 1 | 0 | 2IRp | 0 | 0 | 0 | 0 | 1 | 0 | 0 |
| 0 | 0 | 1 | 1 | 3IRp | 0 | 0 | 0 | 0 | 1 | 1 | 0 |
| 0 | 1 | 0 | 0 | 4IRp | 0 | 0 | 0 | 1 | 0 | 0 | 0 |
| 0 | 1 | 0 | 1 | 5IRp | 0 | 0 | 0 | 1 | 0 | 1 | 0 |
| 0 | 1 | 1 | 0 | 6IRp | 0 | 0 | 0 | 1 | 1 | 0 | 0 |
| 0 | 1 | 1 | 1 | 7IRp | 0 | 0 | 0 | 1 | 1 | 1 | 0 |

| A3 | A2 | A1 | A0 | Vo | X2 | X1 | X0 | Y2 | Y1 | Y0 |
|----|----|----|----|-----|----|----|----|----|----|----|
| 1 | 0 | 0 | 0 | -8IR | 1 | 1 | 1 | 0 | 0 | 0 |
| 1 | 0 | 0 | 1 | -7IR | 1 | 1 | 0 | 0 | 0 | 0 |
| 1 | 0 | 1 | 0 | -6IR | 1 | 0 | 1 | 0 | 0 | 0 |
| 1 | 0 | 1 | 1 | -5IR | 1 | 0 | 0 | 0 | 0 | 0 |
| 1 | 1 | 0 | 0 | -4IR | 0 | 1 | 1 | 0 | 0 | 0 |
| 1 | 1 | 0 | 1 | -3IR | 0 | 1 | 0 | 0 | 0 | 0 |
| 1 | 1 | 1 | 0 | -2IR | 0 | 0 | 1 | 0 | 0 | 0 |
| 1 | 1 | 1 | 1 | -1IR | 0 | 0 | 0 | 0 | 0 | 0 |
| 0 | 0 | 0 | 0 | 0IR | 0 | 0 | 0 | 0 | 0 | 0 |
| 0 | 0 | 0 | 1 | 1IR | 0 | 0 | 0 | 0 | 0 | 1 |
| 0 | 0 | 1 | 0 | 2IR | 0 | 0 | 0 | 0 | 1 | 0 |
| 0 | 0 | 1 | 1 | 3IR | 0 | 0 | 0 | 0 | 1 | 1 |
| 0 | 1 | 0 | 0 | 4IR | 0 | 0 | 0 | 1 | 0 | 0 |
| 0 | 1 | 0 | 1 | 5IR | 0 | 0 | 0 | 1 | 0 | 1 |
| 0 | 1 | 1 | 0 | 6IR | 0 | 0 | 0 | 1 | 1 | 0 |
| 0 | 1 | 1 | 1 | 7IR | 0 | 0 | 0 | 1 | 1 | 1 |

DIGITAL-TO-ANALOG CONVERTER AND RELATED METHOD WITH ONES COMPLEMENT CURRENT SUPPLY STRUCTURE FOR SIMPLIFYING CONTROL LOGIC

CROSS REFERENCE TO RELATED APPLICATIONS

This application claims the benefit of U.S. Provisional Application No. 60/417,410, filed Oct. 10, 2002, and included herein by reference.

BACKGROUND OF INVENTION

1. Field of the Invention

The present invention relates to a digital-to-analog converter and related control method, and more specifically, to a digital-to-analog converter and related method with ones complement current supply structure for simplifying control logic.

2. Description of the Prior Art

Digital-to-analog converters are a common and important structure in the modern electrical circuits. Generally speaking, digital data is much easier to be processed, saved and calculated. When presenting digital data, a digital-to-analog converter is needed to transform the digital data into an analog signal. For instance, a digital microprocessor is used in the control system for controlling the speed of a compact disk driven by a motor or how much power to supply to the pick-up head to write data to the compact disk. However, the digital data of the microprocessor first needs to be transformed to an analog signal by a digital-to-analog converter for controlling the motor rotation or controlling the power of the pick-up head.

Figure 1:
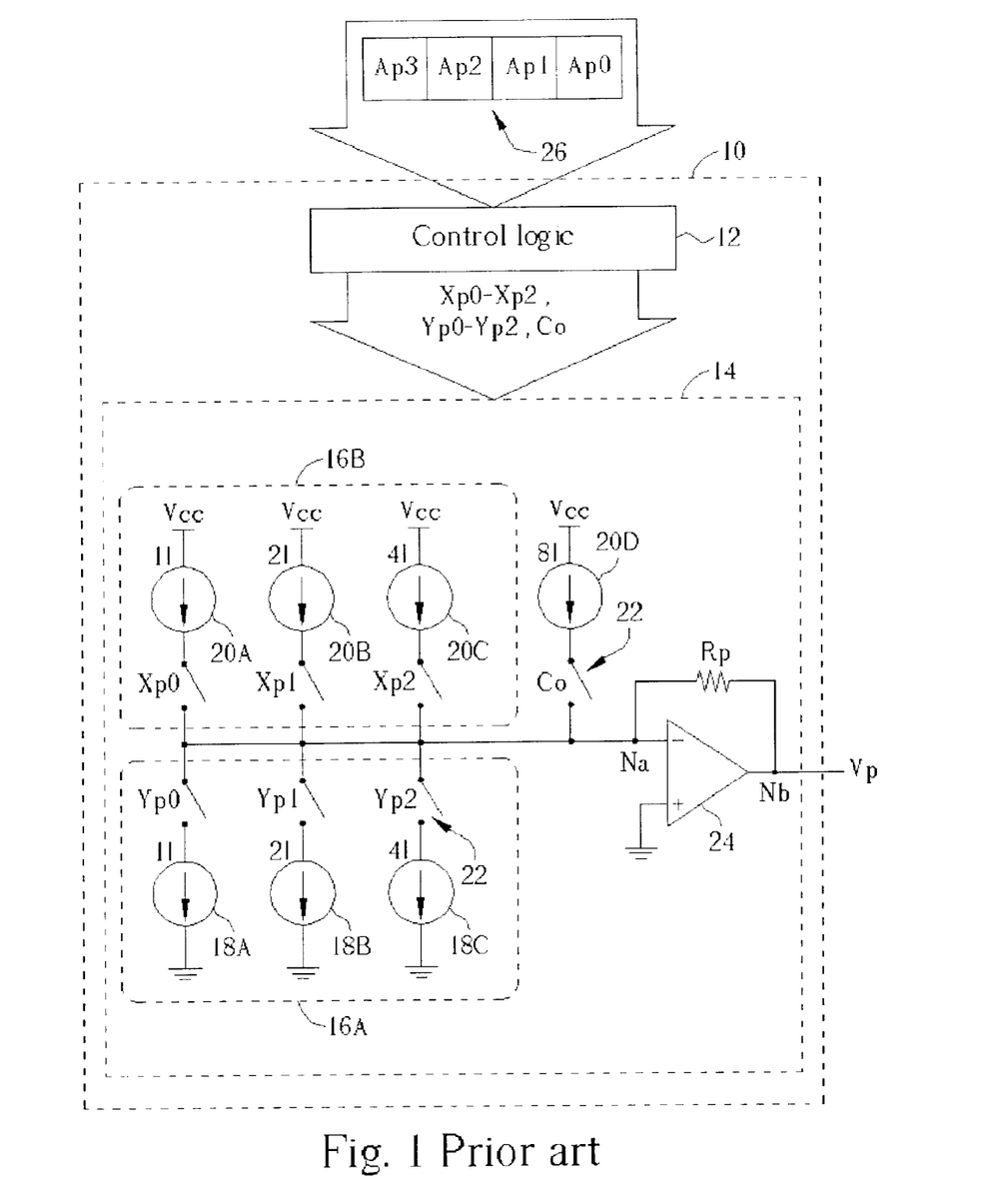
FIG. 1 is a diagram of a four-bit digital-to-analog converter according to the prior art.

Please refer to FIG. 1. FIG. 1 is a diagram of a prior art digital-to-analog converter 10. The example in FIG. 1 is a four-bit digital-to-analog converter. The converter 10 receives a four-bit input code 26 and provides an output voltage Vp as an analog output, the output voltage Vp corresponding to the input code 26. The four-bit input code 26 comprises bits Ap3 to Ap0, the bit Ap3 being the most significant bit, the bit Ap0 being the least significant bit. The converter 10 comprises a control logic 12 and an electrical module 14. The input code 26 is transformed to a plurality of positive control bits Yp0 to Yp2, negative control bits Xp0 to Xp2 and Co. The electrical module 14 provides a bias voltage by a direct current source Vcc and comprises a positive electrical module 16A formed by a plurality of positive current sources 18A to 18C, a negative electrical module 16B formed by a plurality of negative current sources 20A to 20C, a negative current source 20D, a OP amp 24, and a resistance R. Each positive and negative current source is electrically connected to a node Na through a switch 22, and the resistance Rp is electrically connected between the node Na and the output node Nb of the OP amp 24. By the virtual ground at the node Na of the OP amp 24, the current flows through the resistance Rp for setting up the output voltage Vp. In the electrical module 14, different positive and negative current sources provide different currents. The switch 22 is controlled by a corresponding positive control bit or negative control bit for providing a corresponding current to the node Na. As shown in FIG. 1, the negative current sources 20A to 20C provide the negative currents of 1I, 2I, 4I and 8I (the current I is a constant) according to ascending powers of two, the switches of the negative current sources being controlled by the negative control bits Xp0 to Xp2 and Co. The positive current sources 18A to 18C provide the positive currents of 1I, 2I, 4I and 8I similarly, the switches of the positive current sources being controlled by the positive control bits Yp0 to Yp2. For instance, if the negative control bit is 1, the corresponding switch 22 is connected to the node Na, enabling the negative current source to provide a negative current of 1I to the node Na. On the contrary, if the negative control bit is 0, the corresponding switch 22 is off, stopping the negative current source from providing a negative current of 1I to the node Na. In other words, controlling the positive and negative control bits to be 0 or 1 controls the positive and negative current sources to be connected or not connected to the node Na for controlling the current flowing through the resistance Rp and for controlling the magnitude of the corresponding output voltage. The control logic 12 of the converter 10 encodes the input code as the positive and negative control codes to control the output voltage Vp generated by the electrical module 14 according to the input code 26.

Figure 2:
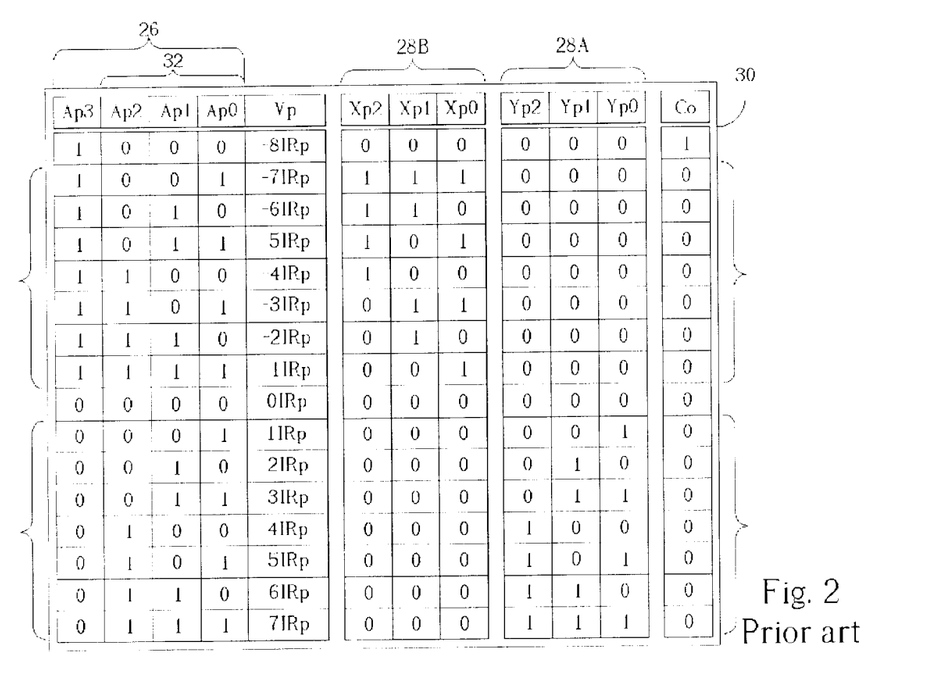
FIG. 2 is a table of a relationship between the functions of the converter of FIG. 1 and the related control codes.

Please refer to FIG. 2 (also refer to FIG. 1). FIG. 2 is a table 30 of the relationship between the input code 26, the output voltage Vp and the positive and negative control bits. For instance, as shown in the table 30, when the input code 26 (bits Ap3 to Ap0) is "0001", the converter 10 provides the output voltage Vp=1*I*Rp (abbreviated as 1IRp). When the input code 26 is "0110", the output voltage will be 6IRp, and so on. In other words, the input code 26 represents a special value in binary, and the converter 10 provides an output voltage Vp with a direct proportion to the special value. As mentioned above, "0001" represents "1" and "0110" represents "6". The converter 10 provides the corresponding voltages 1IRp and 6IRp. In digital arithmetic, a negative value is marked by 2s complement. Therefore, when the converter 10 receives the input code 26 in 2s complement, the converter 10 will provide a corresponding output voltage Vp. As shown in FIG. 2, when the input code 26 is "1111", it represents "−1" by 2s complement, the converter 10 providing a negative voltage 1IRp. When the input code 26 is "1011", it represents "−5" by 2s complement, the converter 10 providing a negative voltage 5IRp.

In order to establish the relationship between the input code and the output voltage in FIG. 2, the converter uses the positive and negative control bits to control the output voltage, connecting or not connecting the positive and negative current sources with the node Na. For instance, when the input code 26 is "0110", the output voltage Vp is 6IRp, the positive control bits Yp2 to Yp1 being "1", the positive current sources 18B and 18C separately providing 2I and 4I positive current to the node Na. There should be a 6IRp output voltage through the resistance Rp. At the same time, the other positive bit Yp0 and the negative control bits Xp2 to Xp0 and Co are "0" for preventing the corresponding current sources from providing current to the node Na. Also, when the input code 26 is "1011", the output voltage Vp is 5IRp, the positive control bits Yp0 to Yp2 being "0", the negative control bits Xp2 to Xp0 and Co respectively being "1","0","1", and "0". The current sources 20C and 20A of the electrical module 14 separately provide negative current 4I and 1I to the node Na for establishing the output voltage Vp through the resistance Rp.

As shown in FIG. 2, when indicating negative values by 2s complement, the most significant bit Ap3 of the input code 26 is a sign code. When the input code 26 represents a positive value or zero, the bit Ap3 is "0". When the input code 26 represents negative value by 2s complement, the bit Ap3 is "1". A value code 32 is formed by the other bits Ap2 to Ap0 of the input code 26, the bits Ap2 and Ap0 respectively being the most and least significant bits. When the input code 26 represents a positive value, the value can be represented by $Ap2*(2^2)+Ap1*(2^1)+Ap0*(2^0)$. Note that the positive current sources 18C to 18A in FIG. 1 respectively provide $4I((2^2)I)$, $2I$, and $1I$ current. Therefore, when the input code represents a positive value, the positive control bits Yp2 to Tp0 are respectively equal to the bits Ap2 to Ap0 (the negative control bits Yp2 to Yp0 and Co are "0") for controlling the total current at the node Na to be in direct proportion to the value of the value code 32, the total current provided by the positive current sources 18A to 18C, and the corresponding output voltage. The positive control bits Yp2 and Yp0 are respectively the most and least significant bits. A positive control code 28A is formed by the control bits Yp2 to Yp0.

As shown in FIG. 1, the negative current sources 20A to 20C respectively correspond to the positive current sources 18A to 18C, providing a magnitude of negative current the same as that of the positive current and a phase of the negative current opposite that of the positive current. The negative control bits Xp2 to Xp0 can correspond to the positive control code 28A. A negative control code 28B is formed by the negative control bits Xp2 to Xp0, the negative control bits Xp2 and Xp0 being respectively the most and least significant bits. Due to the negative current sources 20A to 20C corresponding to the positive current sources 18A to 18C, the magnitude of the negative output voltage Vp provided by the negative current sources according to the negative code 28B is the same as that of the positive output voltage Vp provided by the positive current sources according to the positive code 28A and the phase of the negative output voltage Vp is opposite that of the positive output voltage Vp. As shown in FIG. 2, when the positive control code 28A is "110" (the negative control code 28B is "000"), the positive output voltage Vp is 6IRp. When the negative control code 28B is "110" (the positive control code is "000"), the negative output voltage is 6IRp. In the converter 10 in FIG. 1, when the value code 32 of the input code 26 represents a positive value, the positive control code 28A should be the same as the value code 32 to provide a correct and corresponding output voltage Vp. When providing the same magnitude of a negative output voltage Vp, the negative control code 28B should be the same as the positive control code. It can be inferred that when the prior art converter 10 provides a negative output voltage Vp, the negative control code 28 is the same as the value code 32 that generates the same magnitude of the positive output voltage Vp. For instance, when the value code 32 is "101", the converter 10 provides a 5IRp positive output voltage Vp. When the negative control code 28B is "101" (the positive control code 28A is "000"), the converter 10 provides a −5IRp negative output voltage Vp.

However, when the value code 32 of the input code 26 represents a negative value by 2s complement of a positive value, the converter 10 generates the corresponding negative control code 28B to provide a negative output voltage Vp according to the value code 32, the value code 32 representing the negative value and the negative control code 28B being 2s complement. For instance, when the value code 32 is "011" representing 5, the negative control code 28B is "101" representing 5 to force the converter 10 to provide a 5IRp negative output voltage Vp. When the value code 32 is "001" representing 7 by 2s complement, the negative control code is "111" representing 7 to provide a 7IRp negative output voltage Vp.

Figure 3:
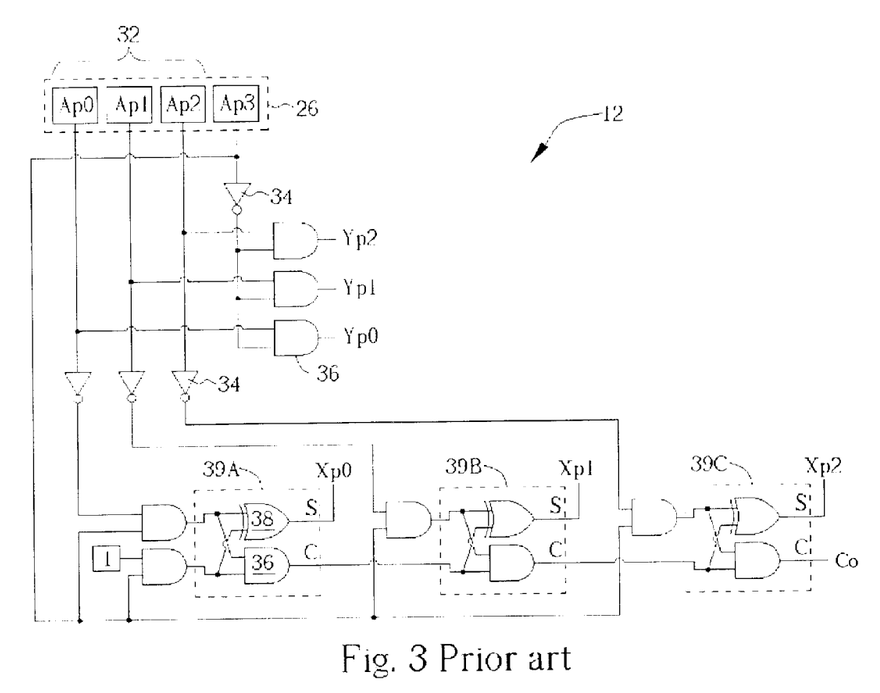
FIG. 3 is a diagram of the control logic circuit of the converter of FIG. 1.

As mentioned above, the control logic 12 needs many logic gates to transform the input code 26 into the corresponding positive and negative control code. Please refer to FIG. 3 (also refer to FIGS. 1 and 2). FIG. 3 is a diagram of the control logic circuit 12 of the converter 10. The control logic 12 comprises a plurality of AND gates 36, inverters 34, and half-adders 39A to 39C. Each half-adder 39A to 39C comprises an AND gate 36 and a XOR gate 38. The two inputs of each half-adder 39A to 39C are respectively the two inputs of the AND gate 36 and the XOR gate 38 and the outputs of the half-adder are the outputs of the XOR gate 38 and the AND gate 36, wherein the output of the XOR gate 38 is connected with a sum node S and the output of the AND gate 36 is connected with a carry node C for inputting the two inputs of the sum node S and the carry node C. When the two inputs of the half-adder are "0" and "1", the sum node S being "1", the carry node C being "0", this means that "0"+"1" equals to "1". When the two inputs are the same ("0" or "1"), the sum node S is always "0" and the carry node C is "0" or "1" respectively. This means that "0"+"0" equals to "0" and that "0"+"1" equals to "10" in binary. As shown in FIG. 3, in the half-adders 39A to 39C, one of the two inputs of a latter half-adder is electrically connected to the carry node C of the former half-adder and the other is used to invert a bit of the value code when the sign code Ap3 is "1". For instance, one of the inputs of the half-adder 39B receives the input from the carry node C of the half-adder 39A and the other is used to receive an input of the inverter of the bit Ap1 when the sign code Ap3 is "1". When the sign code Ap3 is "1", one of the two inputs of the first half-adder 39A receives the input of the inverter 34 of the bit Ap0, and the other receives an input "1" at the same time. As mentioned above, the connection of each half-adder 39A to 39C is to invert the bits Ap0 to Ap2 of the value code 32 for generating an input code (the inverter 34 of the bit Ap2 is the most significant bit) when the sign code Ap3 is "1" and then to add "1", getting the negative control bits Xp0 to Xp2 from the sum nodes S of the half-adders 39A to 39C and the negative control code Co from the carry node C of the half-adder 39C.

As mentioned above, in the prior art converter 10, when the input code 26 represents a positive value, the sign code Ap3 is "0", the positive control code 28A being equal to the bits Ap2 to Ap0 of the value code 32, the negative control code 28C being "000". The positive current sources of the converter 10 can correctly provide a positive current for generating a positive output voltage Vp according to the input code 26. In the control logic 12, the positive control bits Yp0 to Yp2 of the positive control code 28A are generated by separately calculating the bits Ap0 to Ap2 with the inverter 34 of the bit Ap3. When the bit Ap3 is "0", the positive control code 28A is the same as the value code 32. At the same time, the inputs of the half-adders 39A to 39C connected to the AND gates 36 are provided with the bit Ap3. When the bit Ap3 is "0", the half-adders 39A to 39C add "0" to "000" in binary, each sum node S and each carry node C being "0", the negative control bits Xp0 to Xp2 and Co being "0", thereby providing a positive output voltage according to the positive value of the input code 26, as shown in FIG. 2.

On the contrary, when the input code 26 represents a negative value by 2s complement, the sign code Ap3 is "1" and each bit of the value code 32 is "0", the positive control bits Yp0 to Yp2 being "0". The half-adders 39A to 39C add "1" to the inverters of the bits of the value code 32 for generating the negative control bits Xp0 to Xp2. As mentioned above, when the input code represents a negative value by 2s complement, the negative control code 28B is generated by encoding the value code 32 by 2s complement. The inverters of the bits of the value code 32 are the same as the 1s complement of the value code 32. The negative control code 28B is generated by adding "1" to 1s complement of the value code 32, the negative control code also being 2s complement of the value code 32. For instance, when the input code 26 represents 6 by "1010", the valued code 32 is "010", inverting "010" into "101" and then adding 1 to get "110" by binary, "110" being the negative control code 28B, as shown in FIG. 2.

As mentioned above, modern digital microprocessors represent negative values by 2s complement. Digital-to-analog converters receive 2s complement representations of the input code to generate corresponding negative output voltages. However, the control logic 12 of the converter 10 encodes the value code 32 of the input code 26 as the negative control code 28B by 2s complement, that is, it takes more logic gates to form the half-adders. For one thing, this increases the gate count in the prior art converter, the layout, and the power required. For another, the latter half-adders must wait for the carry nodes C of the former half-adders for calculation, requiring a significant amount of additional of time. Moreover, an inverter 34 comprises two transistors, an AND gate 36 comprises six transistors, and an XOR gate 38 comprises thirty-eight transistors. As shown in FIG. 3, the prior art converter requires more than ninety-two transistors.

Figure 4:
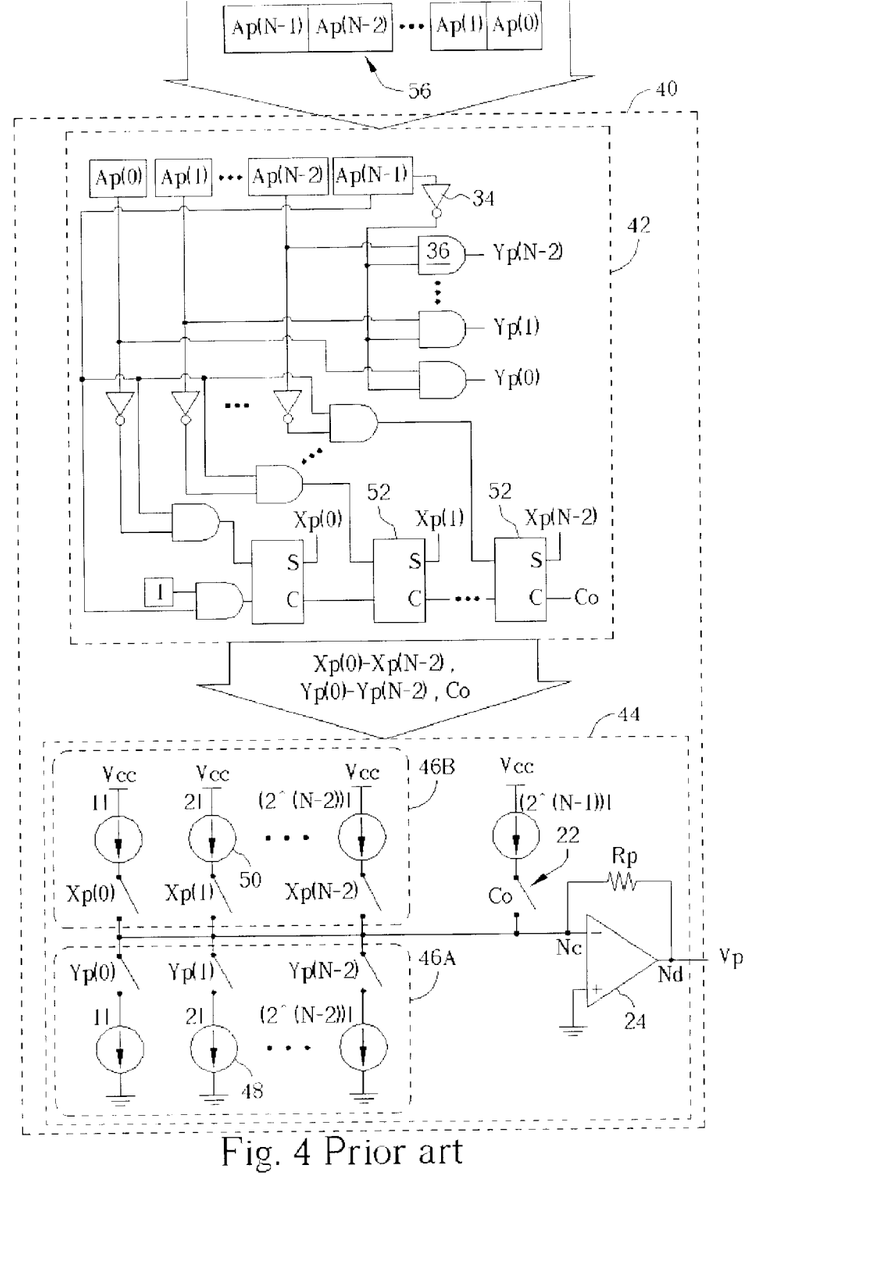
FIG. 4 is a diagram of the converter of FIG. 1 expanded to N bits according to the prior art.

It is obvious that when the prior art converter processes more bits, the control logic needs more transistors. Please refer to FIG. 4. FIG. 4 is a diagram of the prior art converter 40 expanded to N bits. The converter 40 provides an output voltage Vp at the node Nd of the electrical module 44 according to the N bits input code 56. The control logic 42 of the converter 40 generates the negative control bits Xp(0) to Xp(N−1), Co, and the positive control bits Yp(0) to Yp(N−1) according to the bits Ap(0) to Ap(N−1) of the input code 56, Ap(0) and Ap(N−1) respectively being the least and most significant bits. The positive control bits Yp(0) to Yp(N−1) of the positive electrical module 46A respectively correspond to the positive current sources 48 which provide $(2^0)I,(2^1)I$ to $(2^{(N-2)})I$ positive current to control the switch 22 between the positive current sources and the node Nc. The negative control bits Xp(0) to Xp(N−1) of the negative electrical module 46B correspond to the negative current sources 50 which provide $(2^0)I,(2^1)I$ to $(2^{(N-2)})I$ positive current to control whether the negative current sources provide current to the node Nc or not. The OP amp 24 provides an output voltage Vp by the current flowing through the resistance Rp.

FIG. 4 also illustrates a common circuit of the control logic 42. Similar to the control logic 12 in FIG. 3, when the most significant bit Ap(N−1) of the input code 56 is "0", the positive control bits Yp(0) to Yp(N−2) are respectively corresponding to Ap(0) to Ap(N−2) through the AND gates 36 (the negative control bits are "0") to control the positive electrical module 46A to provide an output voltage Vp. When the bit Ap(N−1) is "1", the input code 56 represents negative value by 2s complement, the control logic 42 inverting Ap(0) to Ap(N−2) by N−1 inverters, and then respectively inputting them into (N−1) level half-adders 52 to add "1" for 2s complement, the negative control bits generated according to the input code 56. The converter 40 provides an output voltage Vp according to the negative control bits (the positive control bits are "0"). As shown in the control logic 42 in FIG. 4, it requires more than 30*(N−1)+2 transistors to accomplish this. This increases the layout size and wastes power during operation. Moreover, the N−1 level half-adders increase the delay of the gates and reduces the efficiency of the prior art digital-to-analog converter.

According to the prior art, when the prior art converter controls the negative output voltage generated by the control electrical module, the input code should be encoded by twos complement arithmetic coding for generating a corresponding control code. This requires more logic gates and more complex logical combinations. This also makes the layout of the prior art converter larger, wastes more power, and extends the delay of the gates and lowers the efficiency of the converter.

SUMMARY OF INVENTION

It is therefore a primary objective of the claimed invention to provide a digital-to-analog converter and related method that can change the relation between each negative control bit and input code by an electrical module with a new current supply structure for simplifying control logic to solve the above-mentioned problems.

According to the claimed invention, an assistant electrical module is provided in addition to the original positive and negative electrical modules. When the input code is 2"s complement, the assistant electrical module provides extra current to change the current provided by the negative electrical module and the control code for controlling the negative electrical module to be different. After changing the method of controlling the negative electrical module by the control code, the corresponding control code is encoded by 1s complement arithmetic coding according the input code. Thus, fewer control logic gates are required in the claimed invention than in the prior art. This reduces the layout of the converter in the claimed invention, reduces power waste and the delay of the gates, and improves the efficiency of the converter.

These and other objectives of the claimed invention will no doubt become obvious to those of ordinary skill in the art after reading the following detailed description of the preferred embodiment that is illustrated in the various figures and drawings.

DETAILED DESCRIPTION

Figure 5:
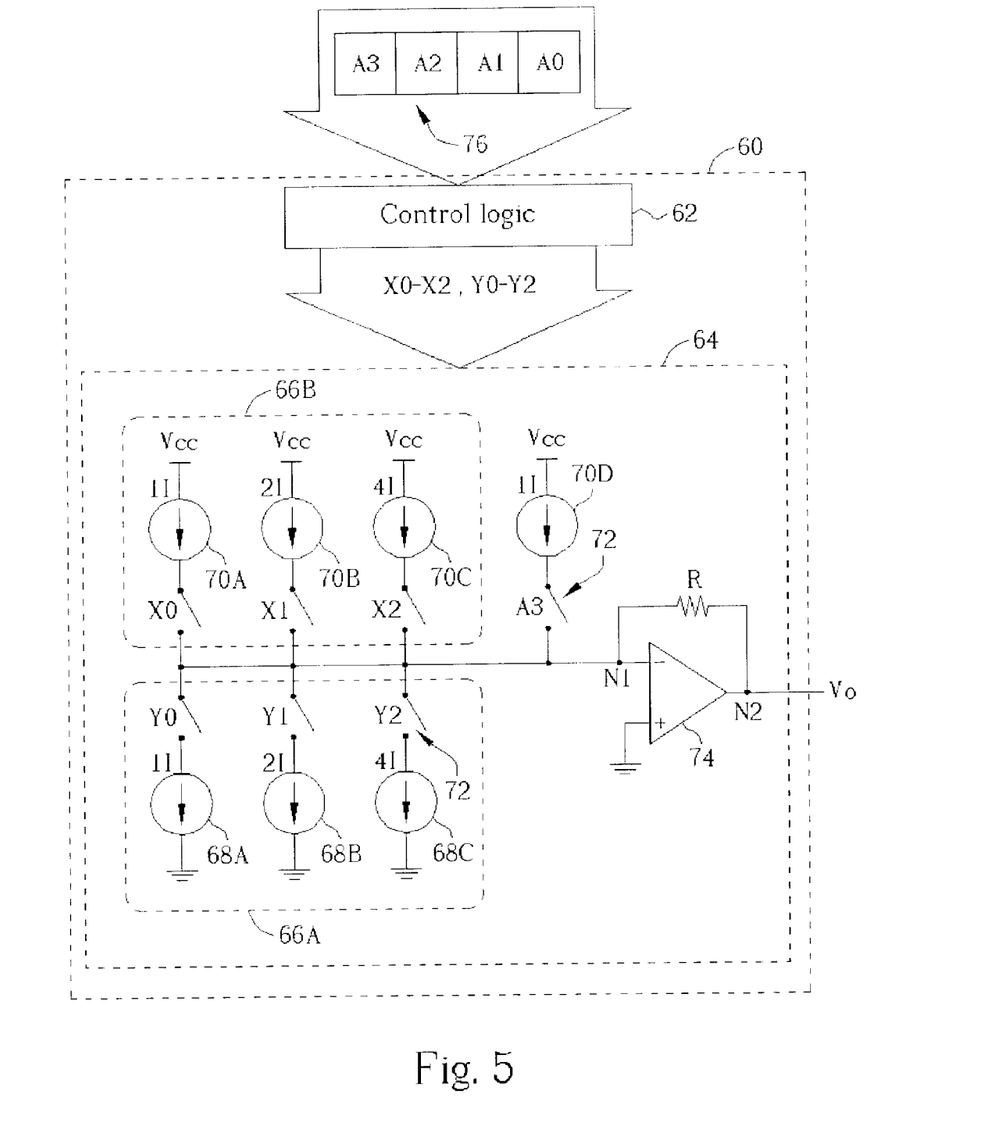
FIG. 5 is a diagram of a four-bit digital-to-analog converter according to the present invention.

Please refer to FIG. 5. In order to disclose the present invention, FIG. 5 illustrates a four-bit digital-to-analog converter 60. The four-bit digital-to-analog converter 60 generates a voltage Vo to the output according to a four-bit input code 76, the four-bit input code 76 being A3 to A0, the bit A3 being the most significant bit, the bit A0 being the least significant bit. The converter 60 comprises a control logic 62 and an electrical module 64 similar in structure to the prior art converter previously described. The control logic 62 generates the corresponding positive control bits Y0 to Y2 and the corresponding negative control bits X0 to X2 according to the input code 76. The electrical module 64 comprises a positive electrical module 66A, a negative electrical module 66B, a negative current source 70D as an assistant electrical module, an OP amp 74, and a resistance R. The positive electrical module 66A comprises positive current sources 68A to 68C, similar to the positive and negative electrical modules in the prior art, that provide positive currents (2^0)I, (2^1)I, (2^2)I according to ascending powers of two, "I" being a constant. Each positive current source 68A to 68C is electrically connected to the node N1 according to the switch 72 and positive control bits Y0 to Y2 control the switches of the positive current sources 68A to 68C respectively. For instance, when the positive control bit Y1 is "1", the positive current source 68B is connected to the node N1, forcing the positive source 68B to provide 2I positive current to the node N1. When the positive control bit Y1 is "0", the positive current source 68B is not connected to the node N1, the positive source 68B not providing positive current to the node N1. Based on the same structure, the negative electrical module 66B comprises negative current sources 70A to 70C according to ascending powers of two, the negative current sources 70A to 70C respectively providing negative currents (2^0)I, (2^1)I, (2^2)I. Each switch between the current sources 70A to 70C and the nodes is controlled by the negative control bits X0 to X2 respectively.

One of the differences between the claimed invention and the prior art is that the electrical module 64 in the claimed invention provides a negative current source 70D as an assistant electrical module, the negative current source 70D providing a negative current of 1I, the switch 72 between the negative current source 70D and the node N1 being controlled by the most significant bit A3 of the input code 76. In other words, when the bit A3 is "1", the negative current source 70D will provide a negative current of 1I to the node N1. When the bit A3 is "0", the switch of the negative current source 70D and the node N1 will be cut off, stopping the current of the negative current source 70D from being provided to the node N1. Through the virtual ground between the OP amp 74 and the node N1, each positive and negative current source 68A to 68C, 70A to 70D provides the total current to the node N1, which flows through the resistance R and gets output as the output voltage Vo at the node N2.

Figure 6:
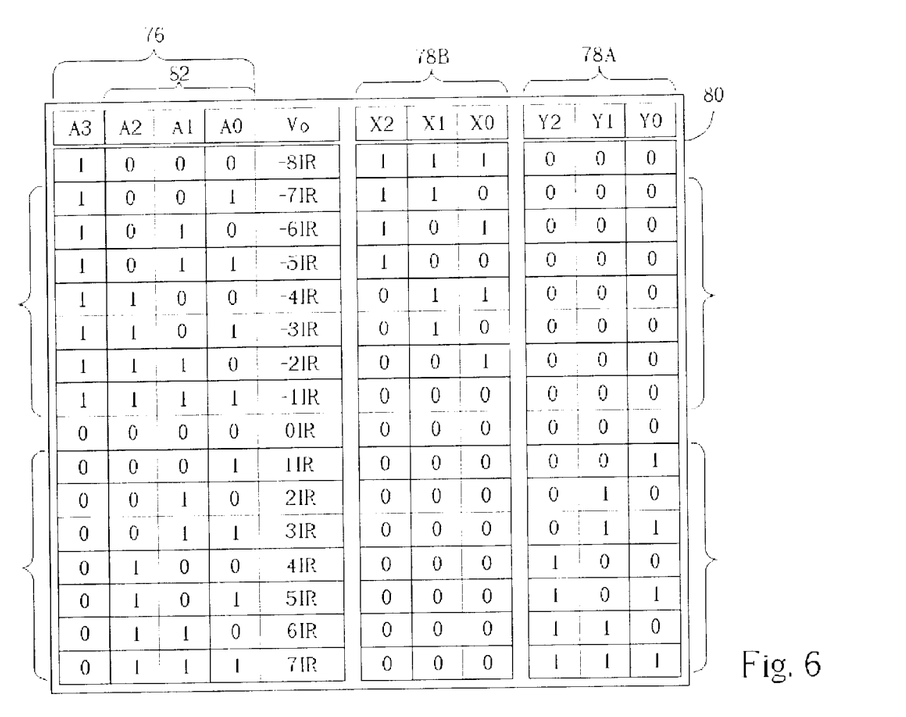
FIG. 6 is a table of a relationship between the functions of the converter of FIG. 5 and the related control codes.

Please refer to FIG. 6 (also refer to FIG. 5). A table 80 shown in FIG. 6 defines a relationship between the input code 76 and the output voltage Vo, the related positive and negative control bits also being listed in the table 80. For compatibility with the typical converter, the relationship between the input code and the output voltage Vo in the four-bit converter 60 of the present invention is the same as that in FIG. 2. For instance, if the input code 76 in the four-bit converter 60 of the present invention is "0110", there will be a positive output voltage of 6IR. If the input code 76 is "1011", there will be a negative output voltage of 5IR, as in the four-bit converter 10 of the prior art in FIG. 1. In other words, if the converter 60 in the present invention receives a 2s complement of the input code 76, it will provide the corresponding negative output voltage Vo. Therefore, the bit A3 of the input code 76 can be regarded as a sign code and the value code would be bits A2 to A0 (the bit A2 being the most significant bit).

The current provided by each positive current source 68A to 68C of the positive electrical module is according to ascending powers of two. If the input code 76 represents a positive value, the positive control bits Y2 to Y0 should be respectively equal to the bits A2 to A0 (the negative control bits X0 to X2 are "0"). This would correctly control the positive current provided by each positive current source of the positive electrical module 66A and provide the positive output voltage Vo according to the input code 76. For instance, when the input code 76 represents the value "6 as "0110", the positive control bits Y2 to Y0 respectively corresponding to the bits A2 to A0 are "1", "1", and "0", the positive current sources 68B and 68C providing a total positive current of 6I to establish the output voltage Vo of 6IR. In a word, when the input code represents a positive value, the relation between the positive control bits Y0 to Y2 and the input code 76 will be the same as the relation between the positive control bits Yp0 to Yp2 and the input code 26 in FIG. 2 (the input code representing a positive value), the combination of the positive control bits Y2 to Y0 being regarded as a positive control code 78A, the bit Y2 being the most significant bit. Note that the negative current source 70D of the assistant electrical module in the present invention is controlled by the sign code A3 of the input code 76. When the sign code A3 is "0", the negative current source 70D does not provide current to the node N1, the output voltage being completely provided by the positive electrical module 66A. In addition, the negative control bits X0 to X2 corresponding to the positive control code 78A are regarded as a negative control code 78B, the negative control bit X2 being the most significant bit.

As mentioned above, modern microprocessors use 2s complement to represent a negative value; therefore, when a converter receives a 2s complement input code, it should provide a corresponding negative output voltage. According to the present invention, when the converter 60 receives the 2s complement input code, the negative current sources should provide a negative current to the node N1 for establishing a negative output voltage Vo. When the input code 76 represents a negative value by 2s complement, the sign code A3 will be "1", the negative current source 70D of the assistant electrical module providing a negative current of 1I to the node N1. According to the negative current provided by the negative current source 70D, the currents provided by the negative current sources 70A to 70C of the negative electrical module 66B are ascending powers of two. The value represented by the negative control code 78B is not equal to the negative value represented by the input code 76. For instance, when the input code represents the negative value of 7 by "1001", the negative control code 78B only represents the value of 6 by "110" to control the negative current sources 70B and 70C of the negative electrical module to provide a negative current of 6I, the rest of the negative current of 1I provided by the negative current source 70D. The total negative current of 7I is provided by the negative electrical module 66B and the negative current source 70D (with "000" of the positive control code 78A). This will provide a negative output voltage Vo(7IR) through the resistance R corresponding to the input code representing 7. As in the mentioned example above, when the input code 76 represents 7 by "1001", the negative control code 78B substantially represents 6 by "110", the remaining absolute value of 1 compensated for by the negative current source 70D.

If the sign code A3 is "1", the negative current source 70D will provide a negative current of 1I. Therefore, when the input code 76 represents a negative value by 2s complement and the negative control code 78B represents a value by binary digit, both of the values are less than the absolute value of the input code 76 by "1". In another example, if the input code 79 represents 3 by "1101" and then the converter 60 provides a negative output voltage Vo of 3IR. The negative control code 78B only represents 2 by "010" (less than 3 by 1). The negative current of 3I will be provided by the negative electrical module 66B and the negative current source 70D to generate an output voltage Vo. Note that the prior art converter 10 in FIG. 2 does not provide an extra negative current source such as the negative current source 70D. The value represented by the negative control code 28B and the absolute value represented by the input code 26 are the same. When the input code 26 represents 3 by "1101" (2s complement), the negative control code also represents 3 by "011".

Compared to the prior art, the relationship between the input code 76 and the negative control code 78B is changed by the negative current of the negative current source 70D in the present invention. This simplifies the process from the input code 76 to the negative control code 78. Referred to FIG. 6, when the sign code A3 is "1", the control code 78B is the same as the 1s complement of the value code 82. The control code 78B is generated by 1s complement of the value code 82. For instance, if the input code 76 is "1010", the value code 82 is "010". Original digits of "0" are converted to "1", and original digits of "1" are converted to "0", the control code 78B becoming "101" generated by 1s complement of the value code 82.

Figure 7:
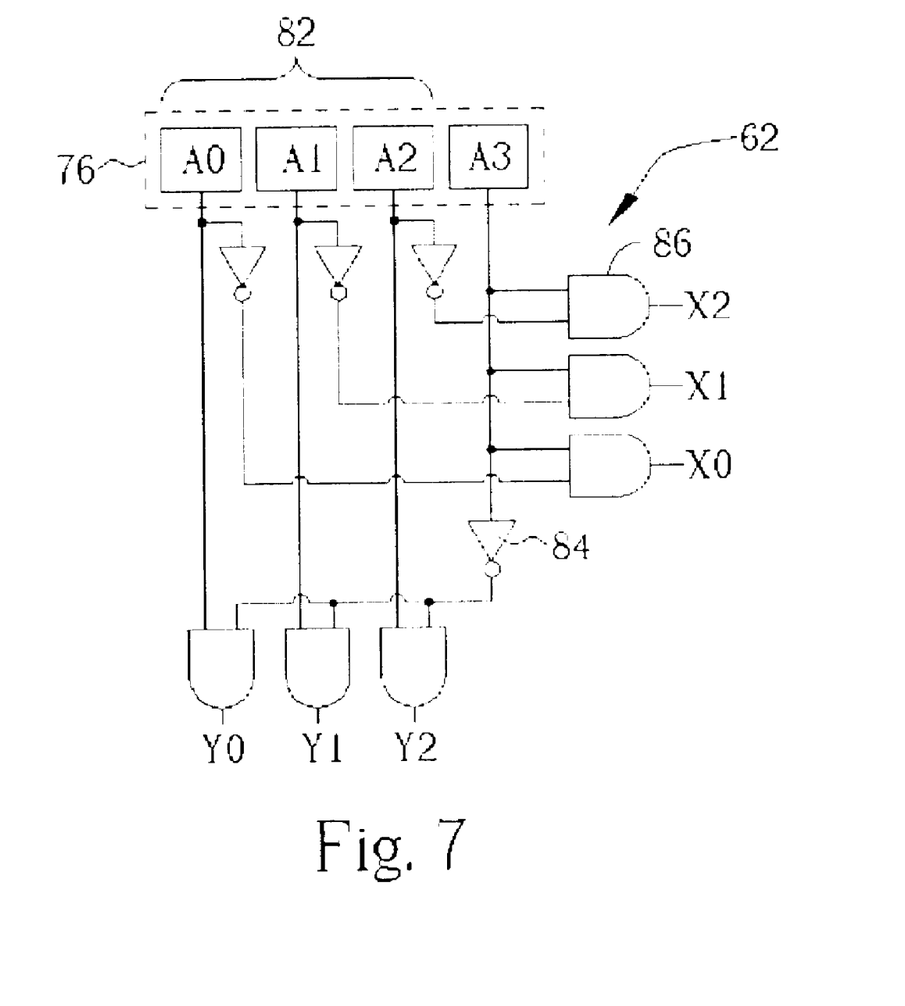
FIG. 7 is a diagram of the control logic circuit of the converter of FIG. 5.

Please refer to FIG. 7 (also refer to FIG. 5 and 6). FIG. 7 is a diagram of the circuit of the control logic 62 according to the present invention. Due to the process of generating the control code simplified by the present invention, the control logic 62 only needs inverters 84 and AND gates 86. As mentioned above, when the input code 76 represents a positive value, the sign code A3 is "0", the positive control code 78A being equal to the value code 82, all negative control bits X0 to X2 being "0". According to the control logic 62, the positive control bits Y0 to Y2 are generated by AND operations of the sign codes A0 to A2 and the inverted sign code A3 respectively. When the input code 76 represents a negative code, the sign code A3 is "1", the negative control bits are generated by the inverter of the value code 82, all positive control bits being "0". First, the bits A0 to A2 are separately converted and are then calculated with the sign code A3 for generating the negative control bits X0 to X2. When the sign code A3 is "1", the control bits X0 to X2 are respectively equal to the inverted values of the bits A0 to A2 to define the relationship of FIG. 6. In FIG. 7, the control logic in the present invention only needs forty-four transistors (four inverters 84 including eight transistors, and six AND gates including thirty-six transistors). Compared to the prior art control logic 12 needing more than ninety transistors, the present invention saves a lot of transistors and reduces the layout size of the control logic, and further reduces the power waste and delays of the gates.

According to the prior art converter 10 in FIGS. 1 to 3, when the input code 26 represents a negative value, the relation between the value code 32 and the negative control code 28B is 2s complement. According to the prior art control logic 12, the negative code 28B is the 2"s complement of the value code 32, the bits of the value code 32 being inverted and then added to "1" using a half-adder. In the present invention, the negative current source 70D provides a negative current to add "1". When the input code 76 represents a negative value, the negative control code 78B of the negative electrical module 66B is generated by inverting the bits of the value code 82. The negative current source 70D provides a negative current to add "1". Comparing FIGS. 1 and 5, the layout in present invention is simplified and the half-adders are reduced in number due to the control logic 62. This efficiently reduces the layout size and the power waste.

Figure 8:
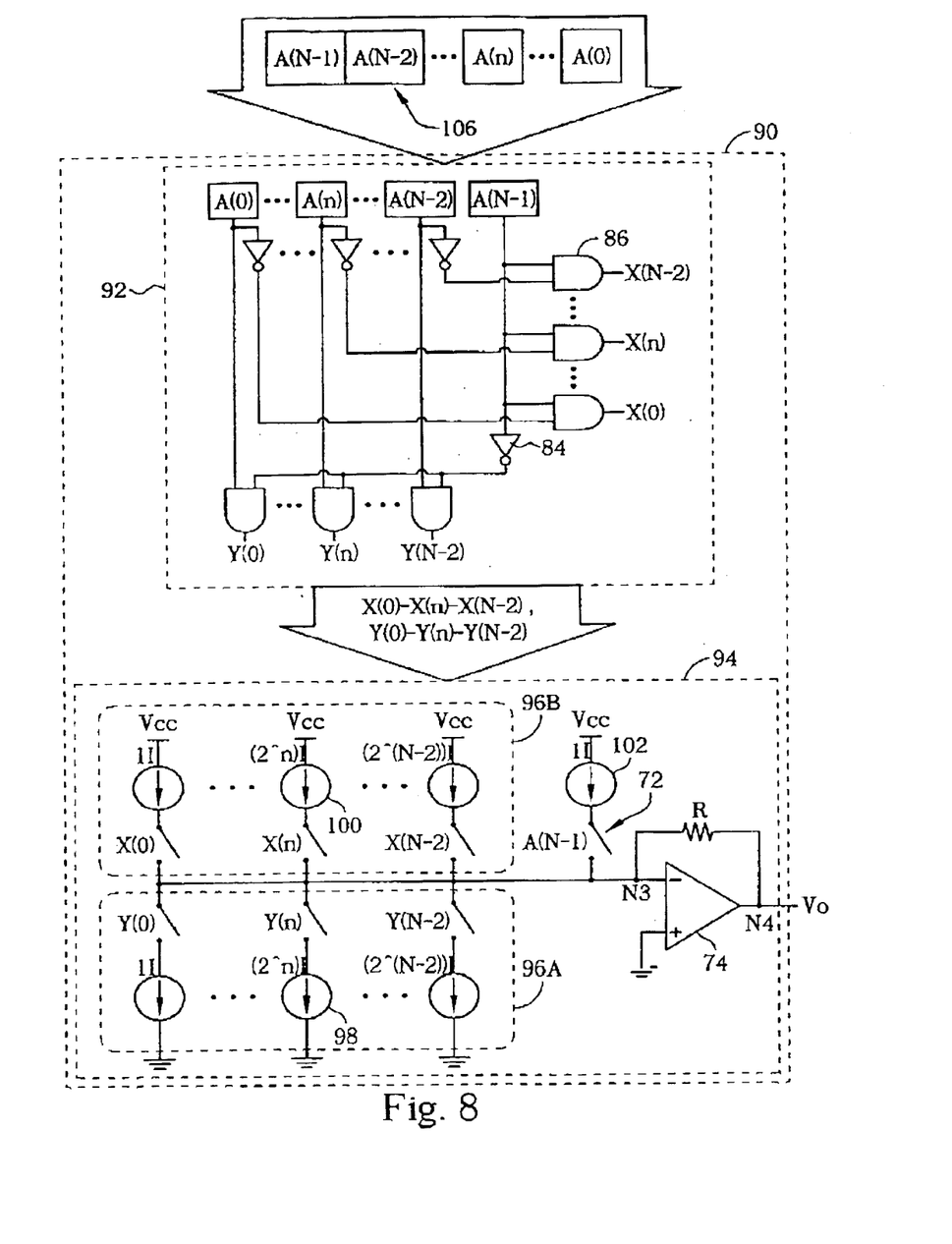
FIG. 8 is a diagram of the converter of FIG. 5 expanded to N bits according to the present invention.

Please refer to FIG. 8. FIG. 8 is a diagram of the converter in the present invention expanded to N bits. A converter 90 receives an N-bit input code 106 and provides a corresponding output voltage Vo. There are N bits A(N−1) to A(0) in the input code 106, the bit A(N−1) being the most significant bit. The converter 90 comprises a control logic 92 and an electrical module 94. The positive control bits Y(0) to Y(N−2) and the negative control bits X(0) to X(N−2) are generated by the control logic 92 corresponding to the input code 106. The electrical module 94 comprises a positive electrical module 96A, a negative electrical module 96B, a negative current source 102 as an assistant electrical module, an OP amp 74, and a resistance R. The positive electrical module 96A comprises N−1 positive current sources 98, the positive current sources 98 providing currents $(2^0)i$, $(2^1)I$ to $(2^{(N-2)})I$ by ascending powers of two. The switches between the positive current sources 98 and the node A3 are controlled by the positive control bits Y(0), Y(1) to Y(N−2). En other words, the switch corresponding to the positive current source providing $(2^n)I$ is controlled by the control bit Y(n) (n is from 0 to (N−2)). The negative electrical module 96B comprises N−1 negative current sources 100. The switch corresponding to the negative current source providing $(2^n)I$ is controlled by the control bit X(n) (n is from 0 to (N−2)). The switch 72 between the negative current source 102 of the assistant electrical module and the node N3 is controlled by the sign code A(N−1) of the input code 106, A(N−1) being the most significant bit of the input code 106. The total current flowing through the node N3 establishes an output voltage through the resistance R.

As mentioned above, when the input code 106 represents a positive value, the sign code A(N−1) is "0", the positive control code Y(0) to Y(N−2) being equal to the bits A(0) to A(N−2), the negative control code X(0) to X(N−2) being "0". When the input code represents a negative value by 2s complement, the negative current source 102 provides an extra negative current of 1I, the sign code A(N−1) being "1". The corresponding negative control bits Y(0) to Y(N−2) are generated by inverting the bits A(0) to A(N−2) of the input code 106, all positive control bits X(0) to X(N−2) being "0". In FIG. 8, the control logic 92 needs N inverters 84 and 2(N−1) AND gates 86. The electrical module 94 provides a corresponding output voltage Vo according to the input code. Note that the prior art control logic 42 in FIG. 4 needs more than 30(N−1)+2 transistors. In contrast, the control logic 92 of the present invention only needs 14(N−1)+2 transistors. This saves a significant amount of transistors and reduces the power waste and the delay of the gates.

To sum up, according to the prior art, when the input code represents a negative value by 2s complement, the negative control bits are generated by 2s complement of the input code to control the negative output voltage. Many half-adders in the control logic are required to add "1" to the binary value (for an N-bit converter, N−1 half-adders are needed). This expands the layout of the control logic, and wastes power and increase the delays of the gates. According to the prior art, for an N-bit converter, the delay of the gates is roughly directly proportional to N. However, in the present invention, when the input code represents a negative value by 2s complement, the extra negative current provided by the assistant electrical module performs the addition of "1". Half-adders are not used for the addition of "1", this simplifying the control logic and saving power. According to the present invention, each negative control bit can be generated by a bit of the input code. When expanded to N bits, the delay of the gates will roughly be a constant, and does not increase with N. This is important, as modern circuits require high accuracy, increased bit output, and faster speed of the operation. The present invention can efficiently reduce the layout size of the control logic, reduce power waste, and improve the efficiency of operation.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A converter for providing an output voltage according to a signed binary input code, the converter comprising:
    a control logic for generating a positive control code and a negative control code according to the input code;
    a positive electrical module for providing a positive current corresponding to the positive control code to an output;
    a negative electrical module for providing a negative current corresponding to the negative control code to the output; and
    an assistant electrical module for providing a non-zero current to the output when the negative electrical module provides the negative current to the output;
wherein the input code includes a sign code and a value code, and the sign code corresponds to a predetermined negative sign code, and the control logic encodes the value code as the negative control code by a first coding method, the first coding method being one's complement arithmetic coding.

2. The converter of claim 1 wherein when the sign code corresponds to a predetermined negative sign code, the control logic encodes the value code as the negative control code by a first coding method; and when the sign code does not correspond to the predetermined negative sign code, the negative control code generated by the control logic prevents the negative electrical module from providing the negative current.

3. The converter of claim 1 wherein when the input code represents a first negative input code, the first negative input code is encoded by a second coding method, the second coding method being two's complement arithmetic coding.

4. The converter of claim 1 wherein the assistant electrical module comprises a unit current source and each current provided by the negative electrical module is a multiple of the unit current.

5. The converter of claim 1 wherein if the input code is a first positive input code, the control logic generates a first positive control code and a first negative control code according to the first positive input code, the first negative control code preventing the negative electrical module from providing the negative current to the output.

6. The converter of claim 1 wherein if the input code is a first negative input code, the control logic generates a second positive control code and a second negative control code according to the first negative input code, the second positive control code preventing the positive electrical module from providing the positive current to the output.

7. The converter of claim 1 wherein the positive control code comprises a plurality of positive control bits, the positive electrical module having a plurality of positive current sources, each positive current source corresponding to a positive control bit in order to provide a positive current to a first node according to the positive control bit, and the negative control code comprises a plurality of negative control bits, the negative electrical module having a plurality of negative current sources, each negative current source corresponding to a negative control bit in order to provide a negative current to the first node according to the negative control bit.

8. The converter of claim 7 wherein the negative current sources of the negative electrical module separately correspond to the positive current sources of the positive electrical module, the negative current sources providing negative current and the positive current sources providing positive current, the magnitude of the negative current being the same as that of the positive current, the phase of the negative current being opposite that of the positive current.

9. A method used in a converter for providing an output voltage according to an signed binary input code, the method comprising:
    generating a positive control code and a negative control code according to the input code;
    providing a positive current to an output according to the positive control code;
    providing a negative current to the output according to the negative control code; and
    providing a constant current to the output when the negative current is provided;
wherein the constant current corresponds to a unit current and the negative current is a multiple of the unit current.

10. The method of claim 9 wherein the input code includes a sign code and a value code.

11. The method of claim 10 wherein steps according to the value code are encoded as the negative control code by a first coding method, the value code according to the sign code of the input code, the steps for generating the positive control code and the negative control code according to the input code.

12. The method of claim 11 wherein the first coding method is one's complement arithmetic coding.

13. The method of claim 11 wherein the value code is encoded as the negative control code by the first coding method according to the sign code of the input code, when the sign code correspond to a predetermined negative sign code, the value code is encoded as the negative control code by the first coding method.

14. The method of claim 13 wherein when the sign code does not correspond to the predetermined negative sign code, a negative current provided by a negative current source is virtually equal to zero according to the negative control code.

15. The method of claim 9 wherein when the input code represents a first negative input code, the absolute value of the value representing the first negative code is equal to the value representing a first positive input code, the magnitude of the negative current being the same as that of the positive current, the phase of the negative current being opposite that of the positive current.

16. The method of claim 9 wherein the input code represents a first negative input code, the first negative input code is encoded by a second coding method, the second coding method is two's complement arithmetic coding.

17. The method of claim 9 wherein the converter is a digital-to-analog converter.

18. An electrical module used in a converter for providing an output voltage according to an input code, the input code including a sign code and a value code, the electrical module comprising:
    a positive electrical module for providing a positive current to an output according to a positive control code;

a negative electrical module for providing a negative current to the output according to a negative control code; and an assistant electrical module for providing a constant current to the output when the negative electrical module provides a negative current to the output.

19. The electrical module of claim 18 further comprising a control logic for generating the positive control code and the negative control code according to the input code.

20. The electrical module of claim 19 wherein:

when the sign code corresponds to a predetermined negative sign code, the control logic encodes the value code as the negative control code by a first coding method; and when the sign code does not correspond to the predetermined negative sign code, the negative control code generated by the control logic prevents the negative electrical module from providing the negative current.

21. The electrical module of claim 19 wherein the control logic encodes the value code as the negative control code by a first coding method, the value code corresponding to the sign code of the input code, the first coding method being one's complement arithmetic coding.

22. The electrical module of claim 19 wherein when the input code represents a first negative input code, the first negative code is encoded by a second coding method, the second coding method being two's complement arithmetic coding.

23. The electrical module of claim 18 wherein the assistant electrical module corresponds to a unit current source and current provided by the negative electrical module is a multiple of the unit current.

24. The electrical module of claim 18 wherein if the input code is a first positive input code, a first negative control code is generated according to the first positive input code, the first negative control code preventing the negative electrical module from providing a negative current to the output.

25. The electrical module of claim 18 wherein if the input code is a first negative input code, a positive control code is generated according to the first negative input code, the positive control code preventing the positive electrical module from providing a positive current to the output.

26. The electrical module of claim 18 wherein the positive control code comprises a plurality of positive control bits, the positive electrical module having a plurality of positive current sources, each positive current source corresponding to a positive control bit in order to provide a positive current to a first node according to the positive control bit, and the negative control code comprises a plurality of negative control bits, the negative electrical module having a plurality of negative current sources, each negative current source corresponding to a negative control bit in order to provide a negative current to the first node according to the negative control bit.

27. The electrical module of claim 26 wherein the negative current sources of the negative electrical module separately correspond to the positive current sources of the positive electrical module, the negative current sources providing negative current and the positive current sources providing positive current, the magnitude of the negative current being the same as that of the positive current, the phase of the negative current being opposite that of the positive current.

* * * * *